(12) United States Patent
Choi et al.

(10) Patent No.: US 12,724,084 B2
(45) Date of Patent: Sep. 1, 2026

(54) APPARATUS, SYSTEM, AND METHOD FOR MANAGEMENT OF A BATTERY

(71) Applicants: HYUNDAI MOTOR COMPANY, Seoul (KR); Kia Corporation, Seoul (KR)

(72) Inventors: Yoon Sung Choi, Hwaseong-si (KR); Ju Seok Kim, Suwon-si (KR); Yoo Hong Jang, Suwon-si (KR); Sang Jin Lee, Goyang-si (KR); Hyo Kyung Lee, Anyang-si (KR); Yo Han Baek, Anyang-si (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 153 days.

(21) Appl. No.: 18/677,422

(22) Filed: May 29, 2024

(65) Prior Publication Data

US 2025/0076401 A1 Mar. 6, 2025

(30) Foreign Application Priority Data

Sep. 4, 2023 (KR) ........................ 10-2023-0117174

(51) Int. Cl.

*G01R 31/392* (2019.01)
*G01R 31/374* (2019.01)
*G01R 31/3842* (2019.01)
*G01R 31/389* (2019.01)
*G01R 31/396* (2019.01)

(52) U.S. Cl.

CPC ......... *G01R 31/392* (2019.01); *G01R 31/374* (2019.01); *G01R 31/3842* (2019.01); *G01R 31/389* (2019.01); *G01R 31/396* (2019.01)

(58) Field of Classification Search

CPC .................................................... G01R 31/396
See application file for complete search history.

(56) References Cited

U.S. PATENT DOCUMENTS

| | | | | |
|---|---|---|---|---|
| 9,840,161 | B2 * | 12/2017 | Chikkannanavar ... | H02J 7/0063 |
| 11,034,259 | B2 * | 6/2021 | Ionescu .................. | B60L 58/22 |
| 2008/0316665 | A1 * | 12/2008 | Masiuk ................ | H02J 7/0031<br>361/89 |

* cited by examiner

*Primary Examiner* — Tung X Nguyen
(74) *Attorney, Agent, or Firm* — Fish & Richardson P.C.

(57) ABSTRACT

A battery management apparatus includes a control circuit configured to determine an internal resistance value for each of one or more battery cells included in a battery pack by using a current change amount of the battery pack and a voltage change amount of the one or more battery cells, and diagnose defects in the one or more battery cells by using internal resistance values of the one or more battery cells, in response to charging the battery pack, where the control circuit is configured to determine the current change amount of the battery pack and the voltage change amount of the one or more battery cells based on a current change request time point requiring a charging current change based on a voltage of the battery pack reaching a predetermined voltage during the charge of the battery pack.

18 Claims, 16 Drawing Sheets

APPARATUS, SYSTEM, AND METHOD FOR MANAGEMENT OF A BATTERY

CROSS-REFERENCE TO RELATED APPLICATION

This application claims priority to and the benefit of Korean Patent Application No. 10-2023-0117174, filed in the Korean Intellectual Property Office on Sep. 4, 2023, the entire contents of which are incorporated herein by reference.

TECHNICAL FIELD

The present disclosure relates to a battery management apparatus, a system, and a method therefor, and a technique for accurately diagnosing a battery cell failure.

BACKGROUND

As a battery system such as an energy storage system (ESS) and an electrical vehicle (EV) becomes widely distributed, safety issues are continuing.

If series resistance inside and outside a battery cell is greater than normal, it may cause a battery fire. Accordingly, battery defects are detected before battery use and a battery pack is constructed using only good quality products, but as a battery deteriorates or is subjected to impacts, internal series resistance increases.

As the internal series resistance of the battery increases, heat generation increases during battery charging and discharging. As heat generation increases, a heat generating area deteriorates and becomes damaged, increasing a risk of fire. Additionally, heat from a heating point is transferred to surroundings, lowering overall performance of the battery cell and accelerating deterioration due to temperature.

In addition, as the internal series resistance increases, a charging end time due to an upper limit cell voltage advances, making it impossible to fully use charging capacity of normal cells. Furthermore, as the series resistance increases, a discharging end time due to a lower limit cell voltage advances, making it impossible to fully use discharging capacity of normal cells.

SUMMARY

The present disclosure is directed to a battery management apparatus, system, and method, capable of diagnosing a battery cell failure by monitoring a change in internal resistance during charging of a battery pack.

The present disclosure is also directed to a battery management apparatus, system, and method, capable of improving battery cell failure diagnosis performance by accurately determining an internal resistance value using a current change amount from a time point of current change request to a time point at which a target current is reached and a voltage change amount from a time point of current change request to a time point of voltage change stabilization during charging of a battery pack.

The present disclosure is also directed to a battery management apparatus, system, and method, capable of increasing accuracy by diagnosing a battery cell failure using deviations in internal resistance values and simply diagnosing the battery cell failure excluding an increase in internal resistance due to battery pack deterioration.

According to an aspect of the present disclosure, a battery management apparatus can include a control circuit configured to determine an internal resistance value for each of one or more battery cells included in a battery pack by using a current change amount of the battery pack and a voltage change amount of the one or more battery cells, and to diagnose defects in the one or more battery cell by using internal resistance values of the one or more battery cells, in response to charging the battery pack including the one or more battery cells; and a storage configured to store data and algorithms driven by the control circuit, wherein the control circuit is configured to determine the current change amount of the battery pack and the voltage change amount of the one or more battery cells based on a current change request time point requiring a charging current change in response to a case where a voltage of the battery pack reaches a predetermined voltage during charging of the battery pack.

In some implementations, the control circuit may be configured to determine the current change amount from the current change request time point to a time point at which a target current requesting the current change is reached.

In some implementations, the control circuit may be configured to determine the voltage change amount from the current change request time point to a voltage change stabilization time point, which is a time point at which the voltage of the battery pack is stabilized.

In some implementations, the battery management apparatus may further include: a voltage sensor configured to measure a voltage of one or more battery cells; and a current sensor configured to measure a current of the battery pack.

In some implementations, the control circuit may be configured to determine the current change amount by using a measured current value in response to a case where a state of charge (SOC) of the battery pack is greater than a predetermined reference value.

In some implementations, the control circuit may be configured to determine the current change amount by using a measured voltage value in response to a case where a temperature of the battery pack is equal to or greater than a predetermined temperature.

In some implementations, the control circuit may be configured to determine a deviation of the internal resistance values for each of one or more battery cells.

In some implementations, the control circuit may be configured to diagnose a corresponding battery cell as a failure in response to a case where the deviation of the internal resistance values for each of the one or more battery cells exceeds a predetermined reference value.

In some implementations, the control circuit may be configured to determine a deviation of the internal resistance values for each of one or more battery cells n times, and to determine that a corresponding battery cell has failed in response to a case where the deviation of the internal resistance values increases compared to past.

In some implementations, the control circuit may be configured to determine that the corresponding battery cell has failed in response to a case where the deviation of the internal resistance values increases compared to the past and an increase amount thereof exceeds a predetermined reference value, or the deviation of the internal resistance values continues to increase.

According to another aspect of the present disclosure, a system can include a battery management apparatus configured to measure a current of a battery pack including one or more battery cells and measure a voltage of each of the one or more battery cells to transmit a voltage value of the one or more battery cells and a current value of the battery pack, measured, in response to charging the battery pack; and a server configured to determine a current change amount of the battery pack and a voltage change amount of the one or more battery cells by using the voltage value of the one or more battery cells and the current value of the battery pack received from the battery management apparatus, to determine an internal resistance value for each of the one or more battery cells by using the current change amount of the battery pack and the voltage change amount of the one or more battery cells, and to diagnose defects in the one or more battery cells by using the internal resistance value for each of the one or more battery cells and transmit a result thereof to the battery management apparatus, wherein the server is configured to determine the current change amount of the battery pack and the voltage change amount of the one or more battery cells based on a current change request time point requiring a charging current change in response to a case where a voltage of the battery pack reaches a predetermined voltage during charging of the battery pack.

In some implementations, the server may be configured to determine the current change amount from the current change request time point to a time point at which a target current requesting the current change is reached.

In some implementations, the server may be configured to determine the voltage change amount from the current change request time point to a voltage change stabilization time point, which is a time point at which the voltage of the battery pack is stabilized.

In some implementations, the server may be configured to determine the current change amount by using a measured current value in response to a case where a state of charge (SOC) of the battery pack is greater than a predetermined reference value.

In some implementations, the server may be configured to determine the current change amount by using a measured voltage value in response to a case where a temperature of the battery pack is equal to or greater than a predetermined temperature.

In some implementations, the server may be configured to determine a deviation of the internal resistance values for each of one or more battery cells.

In some implementations, the server may be configured to diagnose a corresponding battery cell as a failure in response to a case where the deviation of the internal resistance values for each of the one or more battery cells exceeds a predetermined reference value.

In some implementations, the server may be configured to determine a deviation of the internal resistance values for each of one or more battery cells n times, and to determine that a corresponding battery cell has failed in response to a case where the deviation of the internal resistance values increases compared to past.

In some implementations, the battery management apparatus may be positioned in a vehicle and may be configured to perform wireless communication with the server outside the vehicle.

According to another aspect of the present disclosure, a battery management method can include determining, by a processor, a current change amount of a battery pack including one or more battery cells and a voltage change amount of the one or more battery cells based on a current change request time point requiring a charging current change in response to a case where a voltage of the battery pack reaches a predetermined voltage during charging of the battery pack; determining, by the processor, an internal resistance value for each of the one or more battery cells by using the current change amount of the battery pack and the voltage change amount of the one or more battery cells; and diagnosing, by the processor, defects in the one or more battery cells by using the internal resistance value for each of the one or more battery cells.

DETAILED DESCRIPTION

Hereinafter, various exemplary implementations of the present disclosure will be described in detail with reference to FIG. 1 to FIG. 16.

Figure 1:
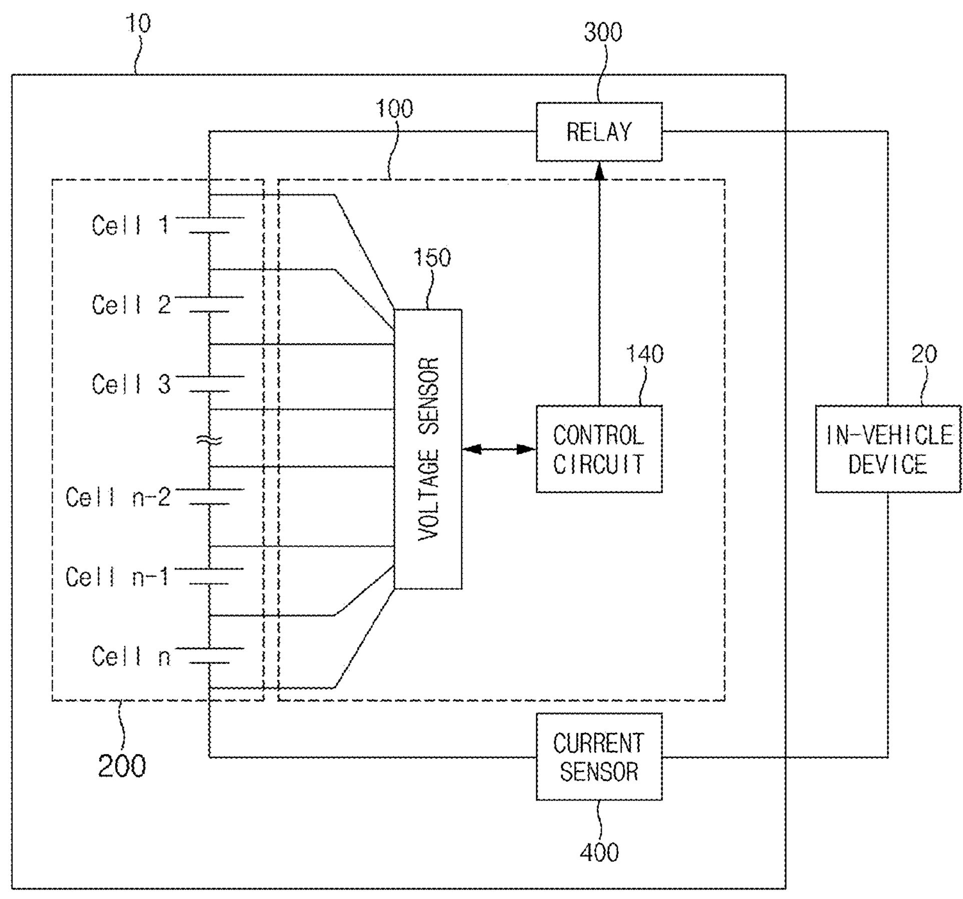
FIG. 1 illustrates a block diagram showing an example of a battery system.

FIG. 1 illustrates a block diagram showing an example of a battery system.

The battery system 10 may be implemented inside a vehicle or separately. In this case, the battery system 10 may be integrally formed with internal control units of the vehicle, or may be implemented as a separate hardware device to be connected to control units of the vehicle by a connection means. For example, the battery system 10 may be implemented integrally with the vehicle, may be implemented in a form that is installed or attached to the vehicle as a configuration separate from the vehicle, or a part thereof may be implemented integrally with the vehicle, and another part may be implemented in a form that is installed or attached to the vehicle as a configuration separate from the vehicle.

The battery system 10 includes a battery management apparatus 100, a battery pack 200, a relay 300, and a current sensor 400.

The battery management apparatus 100 may diagnose whether the battery pack 200 is defective (failed) by monitoring a change in battery internal resistance due to a sudden change in charging current during charging.

A charging speed may be adjusted by changing a charging current in response to a case where a certain level of voltage is reached during rapid charging of a vehicle. In this case, a voltage of the battery pack 200 also changes rapidly in response to a sudden change in charging current, and the battery management apparatus 100 may calculate a current change amount and a voltage change amount in a section where the charging current changes rapidly, and may determine internal resistance of the battery pack 200 using the current change amount and the voltage change amount. Herein, the internal resistance of the battery pack 200 may be obtained by determining the internal resistance for each battery cell (Cell_1 to Cell_n).

The battery management apparatus 100 may determine a current change amount from a current change request time point, which is a time point at which a charging current change is requested, to a target current reaching time point, which is a time point at which a target current is reached, and a voltage change amount from a current change request time point, which is a time point at which a charging current change is requested, to a voltage change stabilization point where a voltage is stabilized. The battery management apparatus 100 may determine an internal resistance value for each battery cell using the determined current change amount and the determined voltage change amount, and may determine a deviation of the internal resistance values for each battery cell. Accordingly, the battery management apparatus 100 may diagnose a defect in each battery cell using the deviation of the internal resistance values for each battery cell.

To this end, the battery management apparatus 100 may include a control circuit 140 and a voltage sensor 150.

The battery pack 200 includes one or more battery cells Cell_1 to Cell_n connected in series.

The relay 300 may transfer a voltage of the battery pack 200 to an in-vehicle device 20 outside the battery system 10. In this case, the in-vehicle device 20 may include a motor, a controller, etc.

The current sensor 400 may measure a current of the battery pack 200.

Figure 2:
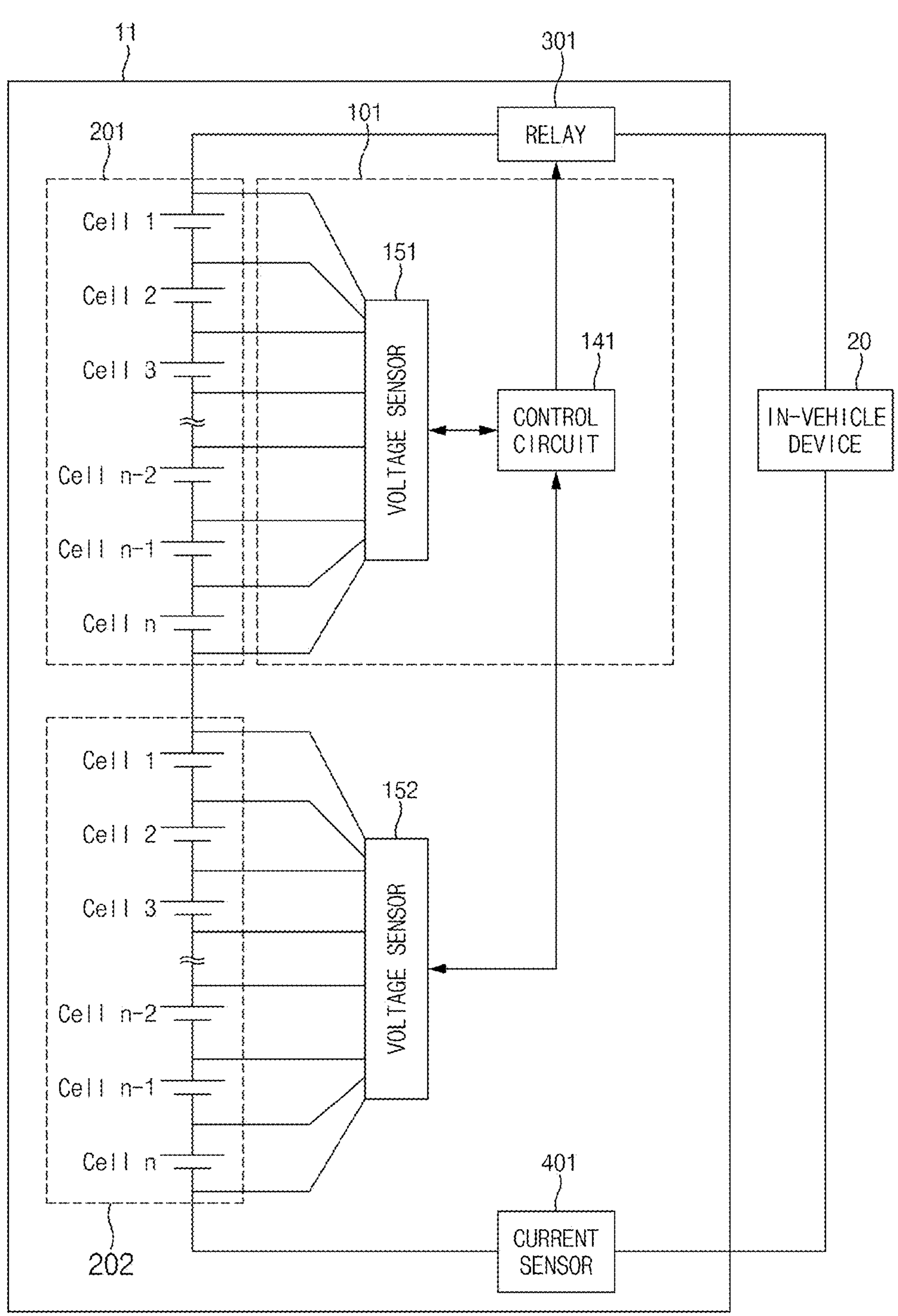
FIG. 2 illustrates a block diagram showing an example of a battery system.

FIG. 2 illustrates a block diagram showing a configuration of a battery system. FIG. 2 illustrates a structure including a plurality of battery packs 201 and 202 including battery cells and a plurality of voltage sensors 151 and 152.

The battery system 11 includes a battery management apparatus 101, a battery pack 201, a relay 301, and a current sensor 401.

However, in some implementations, at least one battery pack 201 is provided, and the voltage sensors 151 and 152 are provided for each battery pack 201.

The control circuit 141 performs a same function as the control circuit 140.

Figure 3:
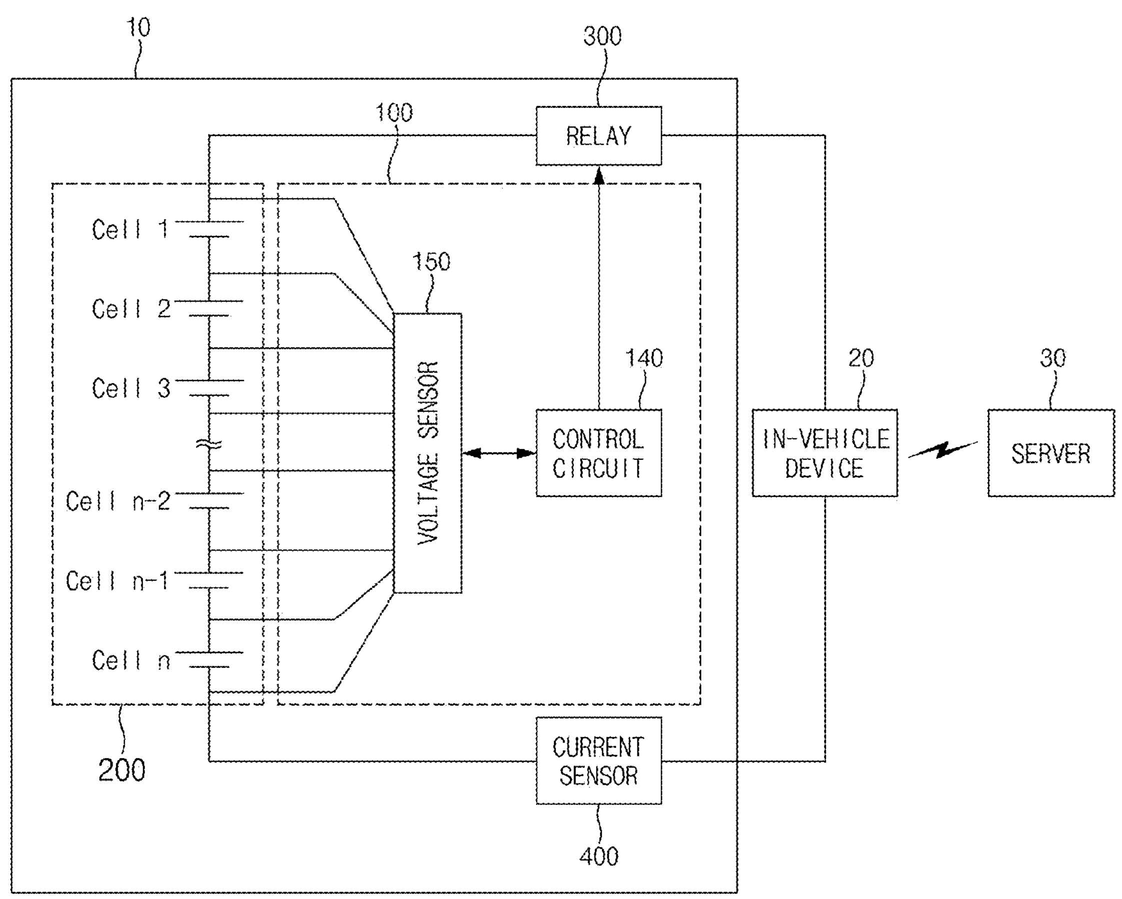
FIG. 3 illustrates a block diagram showing an example of a battery system.

FIG. 3 illustrates a block diagram showing a configuration of a battery system. The battery system 10 has a same configuration as that of the battery system 10 of FIG. 1.

However, the battery system 10 transmits voltage measurement results of one or more battery cells Cell_1 to Cell_n and a current measurement result of the battery pack 200 to the server 30, and the server 30 stores the voltage measurement results of the one or more battery cells Cell_1 to Cell_n and the current measurement result of the battery pack 200. In addition, the server 30 may determine a current change amount from a current change request time point t1 to a target current reaching time point t2 by using a current measurement result of the battery pack 200, and may determine a voltage change amount from the current change request time point t1 to the target current reaching time point t2 by using voltage measurement results of one or more battery cells Cell_1 to Cell_n. In addition, the server 30 may determine internal resistance values and determine a deviation of the internal resistance values by using the current change amount from the current change request time point t1 to the target current reaching time point t2 and the voltage change amount from the current change request time point t1 to the target current reaching time point t2.

Additionally, the server 30 may diagnose whether a battery cell is defective by using a deviation of the internal resistance values for each battery cell. That is, the server 30 may diagnose that a corresponding battery cell is defective in response to a case where the deviation of the internal resistance values exceeds a predetermined threshold, In addition, the server 30 may determine the deviation of the internal resistance values N times, and may diagnose that a corresponding battery cell is defective in response to a case where a deviation of previous internal resistance values increases beyond a predetermined magnitude or continues to increase for a predetermined number of times.

The server 30 may store the deviation of internal resistance values calculated N times, and may transmit a defect diagnosis result of a battery cell to the battery system 10. To this end, the server 30 may include a processor and a communication device.

Figure 4:
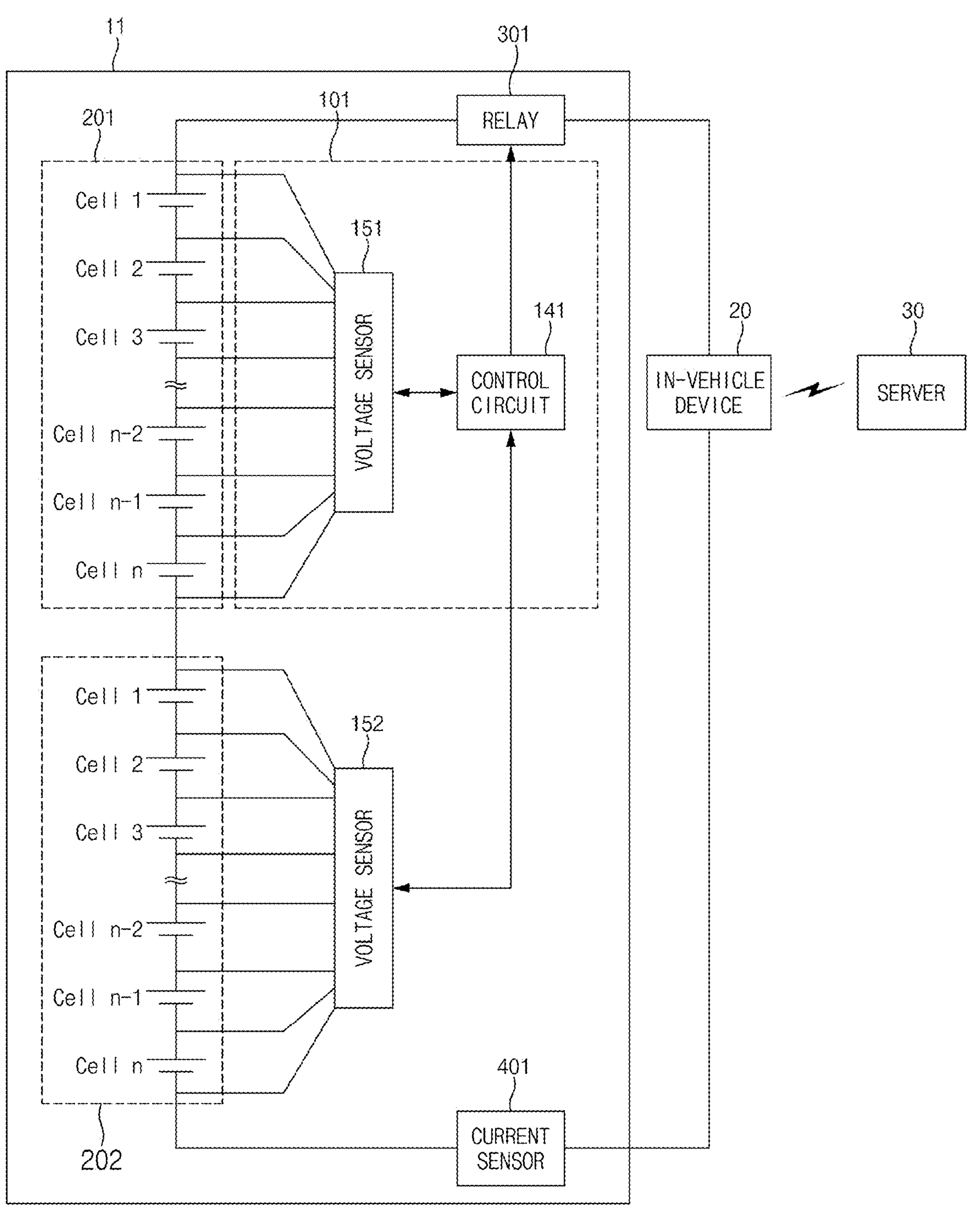
FIG. 4 illustrates a block diagram showing an example of a battery system.

FIG. 4 illustrates a block diagram showing a configuration of a battery system. The battery system 11 may perform a same configuration and functions as those of the battery system 11 and the server 30 in FIG. 2, so a detailed operational description will be omitted.

Figure 5:
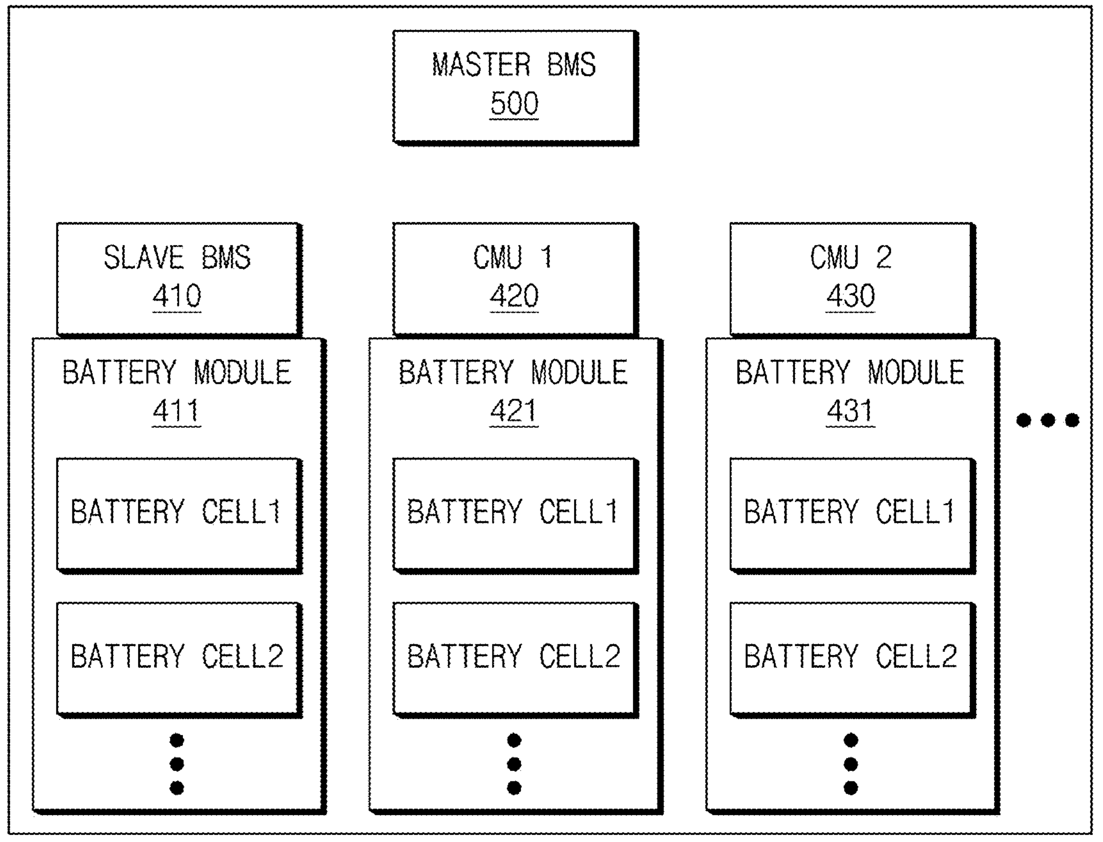
FIG. 5 illustrates a block diagram showing an example of a battery system.

FIG. 5 illustrates a block diagram showing an example configuration of a battery system.

Referring to FIG. 4, the battery system includes a master battery management system (BMS) 500, a slave BMS 410, one or more battery controllers (hereinafter referred to as CMUs 420 and 430), and one or more battery modules 411, 421, and 431.

Each of the one or more battery modules 411, 421, and 431 may include one or more battery cells. The master BMS 500 may obtain information related to the battery module 411 through the slave BMS 410.

The CMU 420 may transfer information (e.g., a measured voltage) of the battery module 421 to the master BMS 500. Additionally, the CMU 430 may transfer information (e.g., measured voltage) of the battery module 431 to the master BMS 500.

Figure 6:
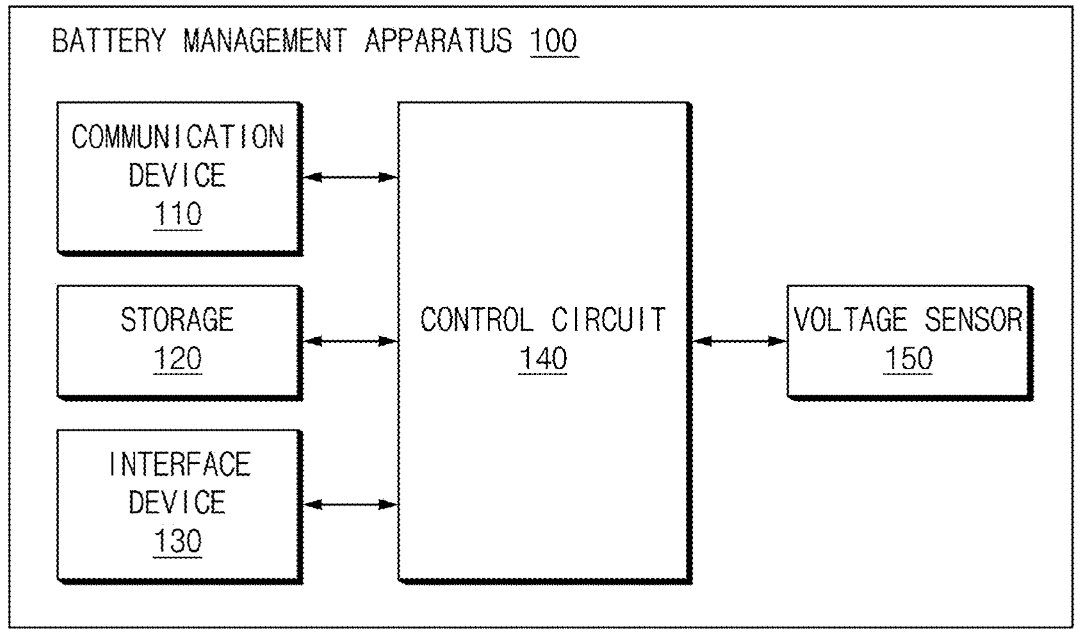
FIG. 6 illustrates a block diagram showing an example of a battery management apparatus.

FIG. 6 illustrates a block diagram showing an example configuration of a battery management apparatus 100.

The battery management apparatus 100 may be implemented as the master BMS 500 of FIG. 5.

In response to charging the battery pack 200 including one or more battery cells Cell 01 to Cell N, the battery management apparatus 100 may determine an internal resistance value for each of one or more battery cells by using a current change amount of the battery pack 200 and a voltage change amount of one or more battery cells Cell 01 to Cell N, and may diagnose defects in one or more battery cells Cell 01 to Cell N by using an internal resistance value for each battery cell.

In addition, the battery management apparatus 100 may determine a deviation of internal resistance values for each battery cell by using the internal resistance value of the one or more battery cells, and may increase defect diagnosis accuracy by diagnosing defects in the one or more battery cells Cell 01 to Cell N using the deviation of the internal resistance values for each battery cell.

Referring to FIG. 6, the battery management apparatus 100 may include a communication device 110, a storage 120, an interface device 130, a control circuit 140, and a voltage sensor 150. In some implementations, the battery management apparatus 100 may be implemented as a single unit by coupling components with each other, and some components may be omitted.

The communication device 110 is a hardware device implemented with various electronic circuits to transmit and receive signals through a wireless or wired connection, and may transmit and receive information based on in-vehicle devices and in-vehicle network communication techniques. As an example, the in-vehicle network communication techniques may include at least one of controller area network (CAN) communication, local interconnect network (LIN) communication, flex-ray communication, or a combination thereof.

In addition, the communication device 110 may perform communication with a server 30, infrastructure, third vehicles outside the vehicle, and the like through a mobile communication technique, a wireless Internet communication, or a short range communication technique. Herein, the wireless communication technique may include at least one of wireless LAN (WLAN), wireless broadband (Wibro), Wi-Fi, world Interoperability for microwave access (Wimax), or a combination thereof.

The mobile communication technique refers to technical standards or communication methods for mobile communication, and may include at least one of global system for mobile communication (GSM), code division multi access (CDMA), code division multi access 2000 (CDMA 2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 4th generation mobile telecommunication (4G), 5th generation mobile telecommunication (5G), or a combination thereof.

The wireless Internet communication refers to a module for wireless Internet access, and may include at least one of wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), or a combination thereof.

In addition, the short range communication technique may include at least one of Bluetooth, ZigBee, ultra wideband (UWB), radio frequency identification (RFID), infrared data association (IrDA), near field communication (NFC), wireless universal serial bus (Wireless USB), or a combination thereof.

As an example, the communication device 110 may communicate with the in-vehicle device 20, the slave BMS 410, the CMUs 420 and 430, etc. to transmit and receive voltage measurement results of the battery cells, internal resistance values, a deviation of the internal resistance values, failure diagnosis results of the battery cells, and the like. In addition, the communication device 110 may communicate with the external server 30, may transmit a voltage value measured for each of one or more battery cells and a current measurement of the battery pack 200 to the server 30, and may receive information related to a defective battery cell among the one or more battery cells from the server 30.

The storage 120 may store data and/or algorithms required for the control circuit 140 to operate, and the like.

As an example, the storage 120 may store voltage measurement results of one or more battery cells Cell_1 to Cell_n measured by the voltage sensor 150, a current measurement result of the battery pack 200 measured by the current sensor 400, determined internal resistance values, a deviation of the determined internal resistance values, diagnosis results of defective battery cells, etc.

The storage 120 may include a storage medium of at least one type among memories of types such as a flash memory, a hard disk, a micro, a card (e.g., a secure digital (SD) card or an extreme digital (XD) card), a random access memory (RAM), a static RAM (SRAM), a read-only memory (ROM), a programmable ROM (PROM), an electrically erasable PROM (EEPROM), a magnetic memory (MRAM), a magnetic disk, and an optical disk.

The interface device 130 may include an input means for receiving a control command from a user and an output means for outputting an operation state of the apparatus 100 and results thereof. Herein, the input means may include a key button, and may include a mouse, a joystick, a jog shuttle, a stylus pen, and the like. Furthermore, the input means may include a soft key implemented on the display. As an example, the interface device 130 may display information related to a battery cell diagnosed as having increased internal resistance, and may output a text to notify a user whether a battery pack has failed.

The interface device 130 may be implemented as a head-up display (HUD), a cluster, an audio video navigation (AVN), or a human machine interface (HM), a human machine interface (HMI).

The output device may include a display, and may also include a voice output means such as a speaker. In the instant case, in a response to a case that a touch sensor formed of a touch film, a touch sheet, or a touch pad is provided on the display, the display may operate as a touch screen, and may be implemented in a form in which an input device and an output device are integrated.

In the instant case, the display may include at least one of a liquid crystal display (LCD), a thin film transistor liquid crystal display (TFT LCD), an organic light emitting diode display (OLED display), a flexible display, a field emission display (FED), a 3D display, or any combination thereof.

The control circuit 140 may be electrically connected to the communication device 110, the storage 120, the interface device 130, and the like, may electrically control each component, and may be an electrical circuit that executes software commands, thereby performing various data processing and calculations described below.

The control circuit 140 may process a signal transferred between components of the flight of the battery management apparatus 100 to perform overall control such that each component can perform its function normally. The control circuit 140 may be implemented in the form of hardware, software, or a combination of hardware and software. For example, the control circuit 140 may be implemented as a microprocessor, but the present disclosure is not limited thereto. For example, it may be, e.g., an electronic control unit (ECU), a micro controller unit (MCU), or other sub-controllers mounted in the vehicle.

In response to charging a battery pack including one or more battery cells, the control circuit 140 may determine an internal resistance value for each of one or more battery cells by using a current change amount of the battery pack and a voltage change amount of one or more battery cells, and may diagnose defects in the one or more battery cell by using internal resistance values of the one or more battery cells.

In response to a case where a voltage of the battery pack reaches a predetermined voltage during charging of the battery pack, the control circuit 140 may determine a current change amount from a time point of requesting a current change to a time point of reaching a target current requesting the current change.

In response to a case where a voltage of the battery pack reaches a predetermined voltage during charging of the battery pack, the control circuit 140 may determine a voltage change amount from a time point of requesting a current change to a voltage change stabilization time point, which is a time point at which the voltage of the battery pack is stabilized.

The control circuit 140 may determine the current change mount using the measured current value in response to a case where state of charge (SOC) of the battery pack is greater than or equal to a predetermined standard value.

The control circuit 140 may determine the current change mount using the measured voltage value in response to a case where the temperature of the battery pack is equal to or higher than a predetermined temperature.

The control circuit 140 may determine a deviation of internal resistance values for each of one or more battery cells.

The control circuit 140 may diagnose a corresponding battery cell as a failure in response to a case where the deviation of the internal resistance values for each of the one or more battery cells exceeds a predetermined reference value.

The control circuit 140 may determine the deviation of the internal resistance values for each of the one or more battery cells n times, and may determine that a corresponding battery cell has failed in response to a case where the deviation of internal resistance values increases compared to the past.

The control circuit 140 may determine that a corresponding battery cell has failed in response to a case where the deviation of the internal resistance values increases compared to the past and an increase amount thereof exceeds a predetermined reference value, or the deviation of the internal resistance values continues to increase.

In FIG. 3 and FIG. 4, functions of the above-described control circuit 140 may be mounted on the server 30, to diagnose a battery cell failure by determining the internal resistance value for each battery cell and the deviation of the internal resistance values for each battery cell by the server 30.

Figure 7:
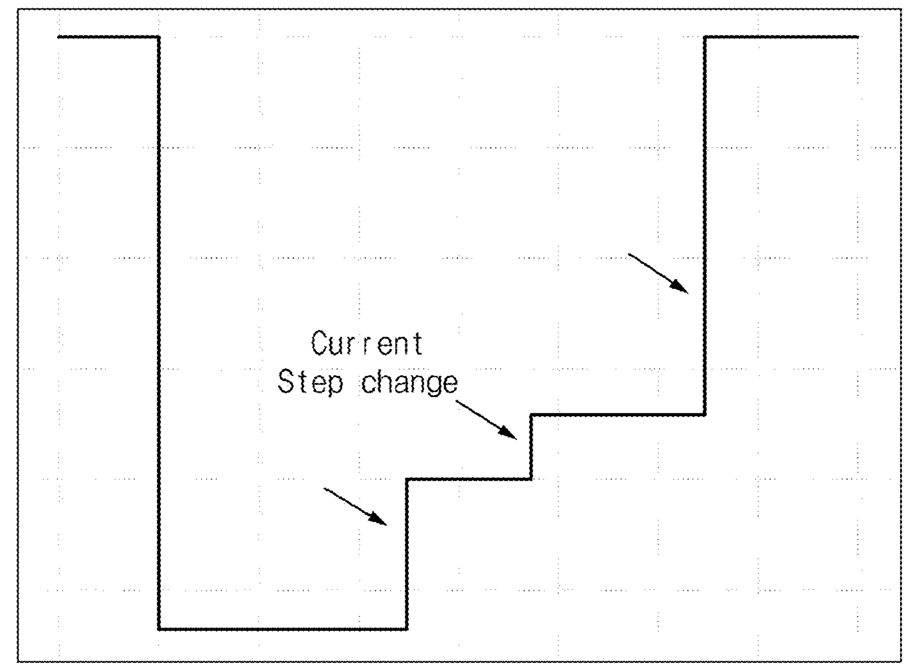
FIG. 7 illustrates an example of an ideal current profile.
Figure 8:
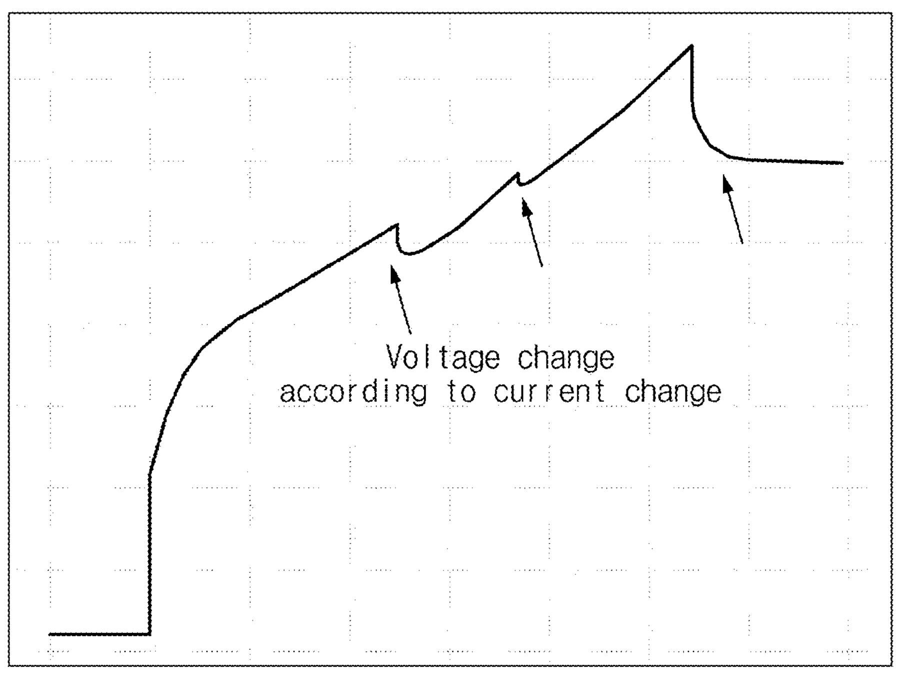
FIG. 8 illustrates an example of an ideal voltage profile.

FIG. 7 illustrates an example of an ideal current profile, and FIG. 8 illustrates an example of an ideal voltage profile.

Ideally, during charging of the battery pack 200, a current flowing through the battery pack 200 increases and changes step by step as illustrated in FIG. 7. In addition, ideally, during charging of the battery pack 200, a voltage of the battery pack 200 increases and changes as illustrated in FIG. 8. However, during charging of the battery pack 200, an actual change in current increases as illustrated in FIG. 9.

Figure 9:
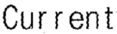
FIG. 9 illustrates an example of an actual current profile.
Figure 9:
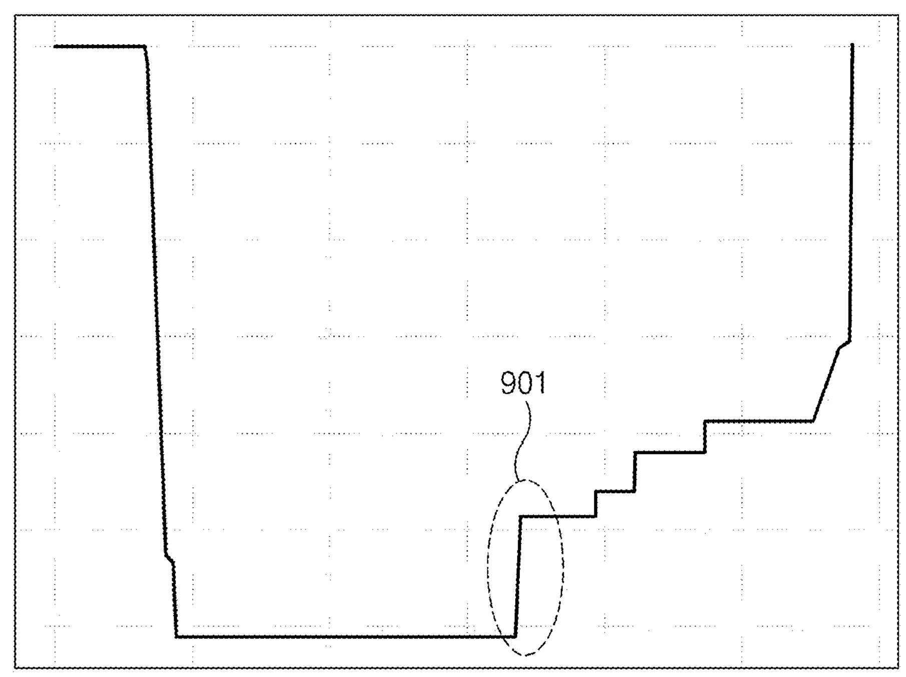
Figure 10:
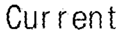
FIG. 10 illustrates an example of an actual current profile at a time point of current change request.
Figure 10:
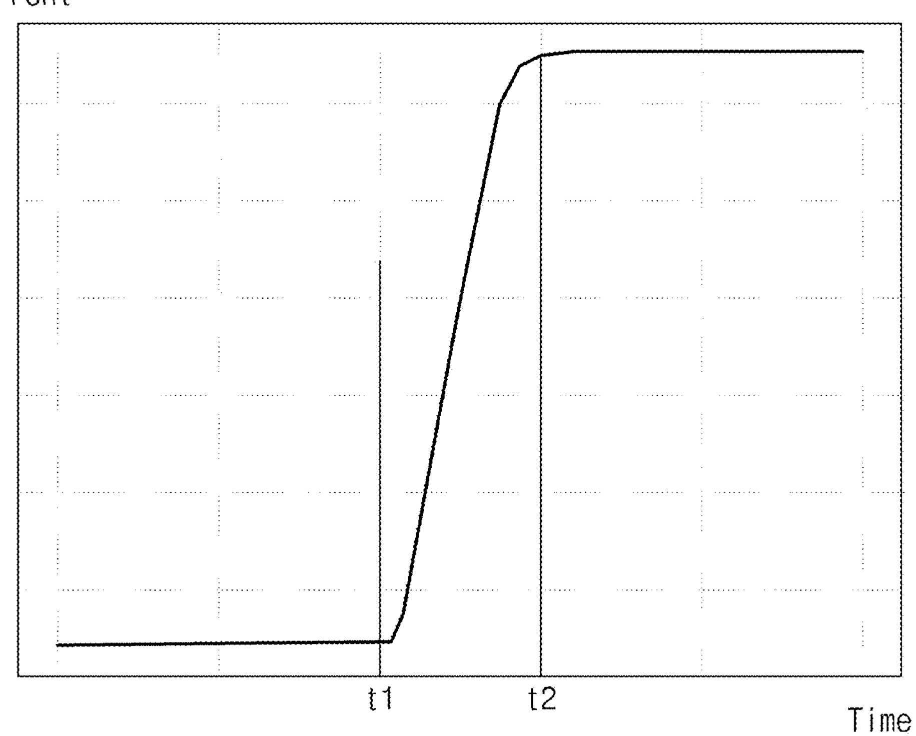

FIG. 9 illustrates an example of an actual current profile, and FIG. 10 illustrates an example of an actual current profile at a time point of current change request.

In response to requesting actual current change during charging of battery pack 200 as illustrated in a view 901 of FIG. 9, a target current is reached after a certain period of time as illustrated in FIG. 10 instead of reaching the target current immediately. In other words, there may be a difference between a time point at which the current change is requested and a time point at which an actual target current is reached. FIG. 10 illustrates an enlarged view showing the view 901 of FIG. 9.

In FIG. 10, t1 refers to a current change request time point, and t2 refers to a target current reaching time point. The target current refers to a current value for which a current change is requested.

Accordingly, the battery management apparatus 100 may determine a current change amount from the current change request time point t1 to the target current reaching time point t2 as shown in Equation 1.

$$\Delta\text{current} = \text{current}(t2) - \text{current}(t1) \quad \text{(Equation 1)}$$

Δcurrent refers to the current change amount, the current (t2) refers to a current value at the target current reaching time point t2, and the current(t1) refers to a current value at the current change request time point t1.

In this case, the current change amount may indicate the current change amount of the battery pack 200.

Figure 11:
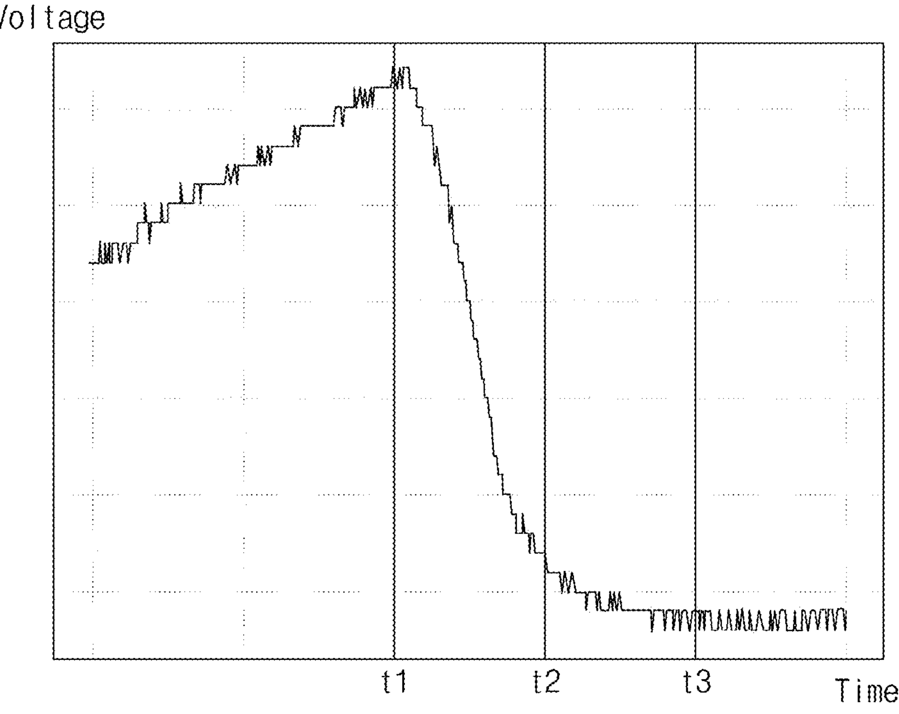
FIG. 11 illustrates an example of an actual current profile at a time point of current change request.

FIG. 11 illustrates an example of an actual current profile at a time point of current change request.

The battery management apparatus 100 may determine a voltage change amount from the current change request time point t1 to the target current reaching time point t2. However, referring to FIG. 11, although the target current reaching time point t2 is reached according to a current change, a significant voltage change continues according to the current change. That is, although a target current is reached, it may be necessary to determine a voltage change up to a section where a voltage is stabilized.

Accordingly, the battery management apparatus 100 may determine a voltage change amount from the current change request time point t1 to a voltage change stabilization time point t3 as shown in Equation 2.

$$\Delta\text{voltage} = \text{voltage}(t1) - \text{voltage}(t3) \quad \text{(Equation 2)}$$

Δvoltage refers to the voltage change amount, the voltage (t1) refers to a voltage value at the current change request time point t1, and the voltage(t3) refers to a voltage value at the voltage change stabilization time point t3.

In addition, the battery management apparatus 100 may determine the voltage change amount by subtracting a minimum voltage among voltages from the current change request time point t1 to the voltage change stabilization time point t3 from a maximum voltage among the voltages from the current change request time point t1 to the voltage change stabilization time point t3.

$$\Delta\text{voltage} = \{\max(\text{voltage}[t1:t3]) - \min(\text{voltage}[t1:t3])\} \text{ in section } t1 \text{ to } t3) \quad \text{(Equation 3)}$$

max(voltage[t1:t3]) in a section from t1 to t3 indicates the maximum voltage among the voltages from the current change request time point t1 to the voltage change stabilization time point t3, and min(voltage[t1:t3]) indicates the minimum voltage among the voltages from the current change request time point t1 to the voltage change stabilization time point t3.

Accordingly, the battery management apparatus 100 may determine internal resistance using the current change amount determined as in Equation 1 and the voltage change amount determined as in Equation 2 or Equation 3.

In this case, the voltage change amount may indicate the voltage change amount of each of the battery cells Cell 01 to Cell N.

$$\text{Internal resistance value} = \text{voltage change } (\Delta\text{voltage})/\text{current change } (\Delta\text{current}) \quad \text{(Equation 4)}$$

The battery management apparatus 100 may determine an internal resistance value of each battery cell each time it is charged, and may determine the internal resistance value of each battery cell a predetermined number of times each time it is charged. For example, during charging, the internal resistance value for each battery cell may be determined once, and the internal resistance value for each battery cell may be determined twice or more.

Figure 12:
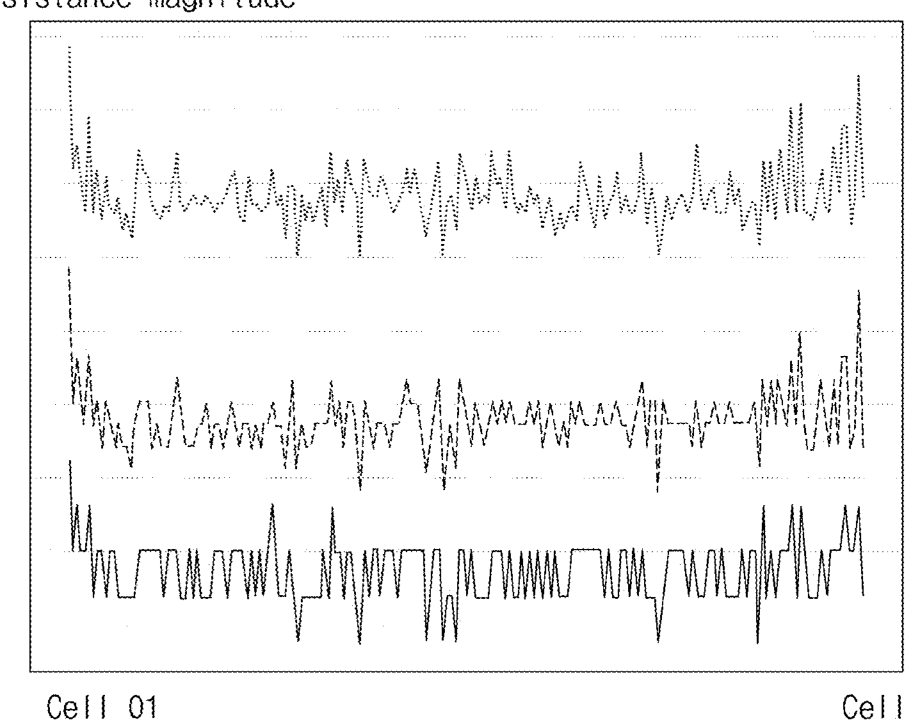
FIG. 12 illustrates an example of an internal resistance value for each battery cell.

FIG. 12 illustrates an example of an internal resistance value for each battery cell. FIG. 12 shows an example in which internal resistance values of battery cells (Cell 01 to Cell N) are determined three times (0 times, 1 time, and 2 times). For example, the internal resistance value may be determined three times during one charge, or the internal resistance value may be determined for each of the three charges to obtain three internal resistance values.

The battery management apparatus 100 may determine a deviation of the internal resistance values of the battery cells Cell 01 to Cell N determined n times as shown in FIG. 12.

Figure 13:
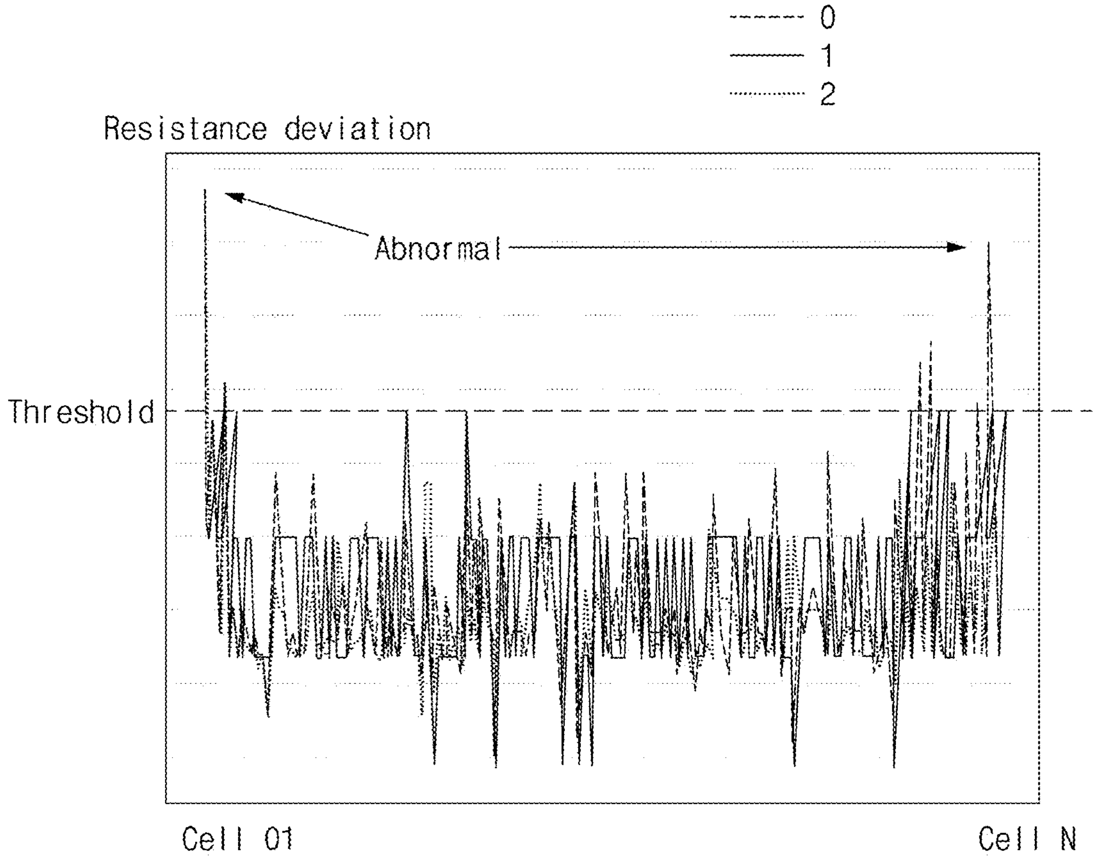
FIG. 13 illustrates an example of an internal resistance variation of a battery cell.

FIG. 13 illustrates an example of an internal resistance variation of a battery cell.

Referring to FIG. 13, the battery management apparatus 100 may determine whether the deviation of the internal resistance values determined three times (0 times, 1 time, and 2 times) exceeds a predetermined threshold. In this case, the threshold may be determined in advance by experimental values.

The battery management apparatus 100 may determine that a corresponding battery cell is normal in response to a case where the deviation of the internal resistance values determined 3 times (0 times, 1 time, 2 times) is equal to or smaller than a predetermined threshold, and may determine that it is a defective cell in response to a case exceeding a predetermined threshold.

An internal resistance value of a defective battery pack 200 is generally greater than that of a normal battery pack 200. However, although the battery pack 200 deteriorates, the internal resistance value of the battery pack 200 may increase.

Accordingly, according to the present disclosure, it is possible to accurately determine whether the increase in internal resistance of the battery pack 200 is due to deterioration or a defect in the battery pack 200 by using the deviation of the internal resistance values for each battery cell.

As such, the battery management apparatus 100 may determine the deviation of the internal resistance values in response to a case where the deviation of the internal resistance values exceeds the threshold, and may determine that the corresponding battery cell is defective, and in FIG. 13, that of the battery cells Cell 01 and Cell N exceed the threshold, and thus it may be determined to be defective.

However, in order to increase the accuracy of diagnosing battery cell defects, the battery management apparatus 100 may diagnose a defect in the battery cells by determining the deviation of the internal resistance values n times and determining whether there is an increase compared to a previous time.

Figure 14:
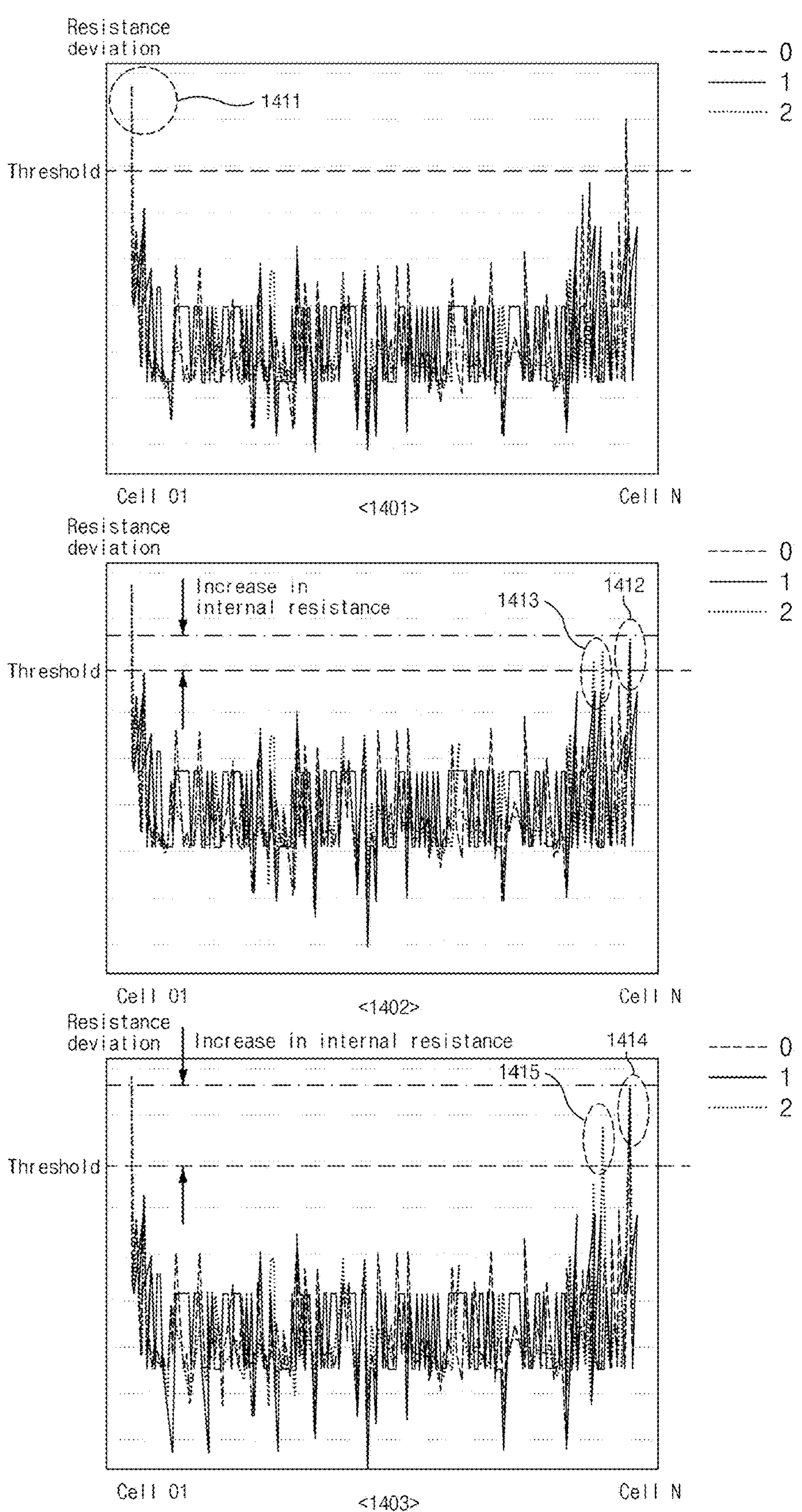
FIG. 14 illustrates an example of an increase in internal resistance variation of a battery cell.

FIG. 14 illustrates an example of an increase in internal resistance variation of a battery cell.

A view 1401 in FIG. 14 shows a result of determining the deviation of the internal resistance value one time, a view 1402 shows a result of determining the deviation of internal resistance values four times, and a view 1403 shows a result of determining the deviation of the internal resistance values 10 times.

That is, the battery cell 01 (1411) may be diagnosed as defective in response to determining the deviation of the internal resistance values 10 times in total and determining the deviation of the internal resistance value 1 time in the view 1401.

It may be seen that internal resistance values of the battery cells 1412 and 1413 slightly increased and slightly exceeded the threshold in response to determining the deviation of the internal resistance values 4 times in the view 1402. In the view 1403, in response to determining the deviation of the internal resistance values 10 times, as the internal resistance values of the battery cells 1414 and 1415 increase significantly and completely exceed the threshold, the battery cells 1414 and 1415 may also be diagnosed as defective.

As such, the battery management apparatus 100 may diagnose whether a battery cell is defective by determining whether there is an increase compared to the deviation of past internal resistance values. In addition, the battery management apparatus 100 may diagnose that the battery cell is defective in response to a case where the increase compared to the deviation of the past internal resistance values exceeds a predetermined reference value or a continuous increase compared to the deviation of the past internal resistance values occurs, For example, it may be seen that, for the battery cells 1412 and 1413, it increases partially in response to the determination of the deviation of the internal resistance values 4 times, and further increases in response to the determination of the deviation of the internal resistance values 10 times, continuing to increase.

Figure 15:
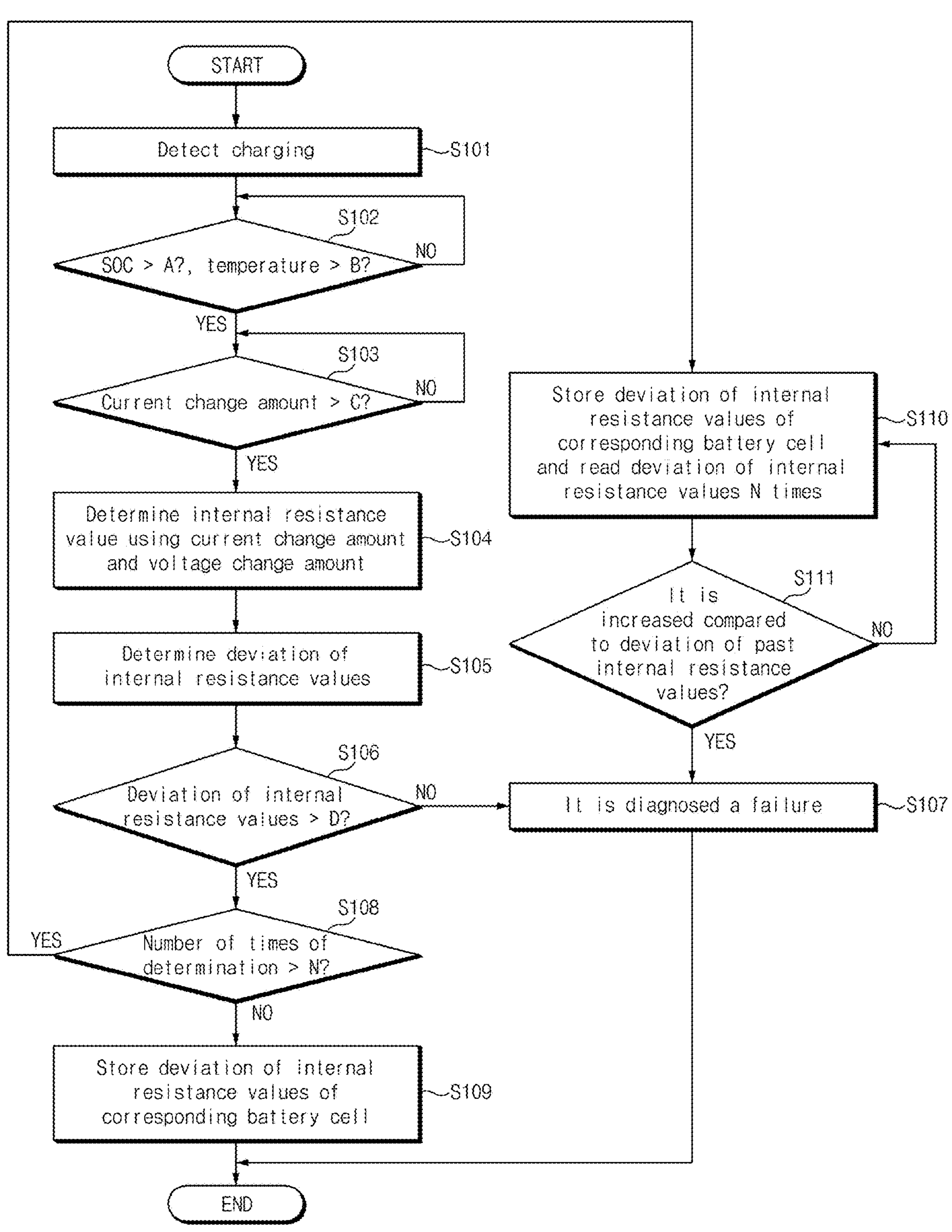
FIG. 15 illustrates an exemplary flowchart for describing a battery failure diagnosis method while a vehicle with a battery management apparatus is charged.

Hereinafter, a battery failure diagnosis method will be described with reference to FIG. 15. FIG. 15 illustrates an example flowchart for describing a battery failure diagnosis method while a vehicle with a battery management apparatus is charged.

Hereinafter, it is assumed that the battery management apparatus 100 of FIG. 1 performs a process of FIG. 15. In addition, in the description of FIG. 15, operations described as being performed by a device may be understood as being controlled by the control circuit 140 of the battery management apparatus 100. In some implementations, operations of steps S101 to S111 may be performed sequentially, but may not necessarily be performed sequentially. For example, an order of each operation may be changed, and at least two operations may be performed in parallel.

Referring to FIG. 15, the battery management apparatus 100 may detect start of charging of the battery pack 200, and may determine whether a state of charge (SOC) exceeds a predetermined threshold A (S101). In addition, the battery management apparatus 100 may exclude the current change amount under a low SOC condition and the current change amount generated at low temperature to increase accuracy in determining internal resistance values. For example, the battery management apparatus 100 may determine the internal resistance value by using the current change amount determined in response to a minimum SOC of 30% or more and the current change amount determined in response to a minimum SOC of 10% or more.

The battery management apparatus 100 determines a current change amount from the current change request time point t1 to the target current reaching time point t2, and determines whether the current change amount is greater than a predetermined threshold C (S103).

Accordingly, in response to a case where the current change amount from the current change request time point t1 to the target current reaching time point t2 is greater than the predetermined threshold C, a voltage change amount from the current change request time point t1 to the target current reaching time point t2 is determined, and an internal resistance value is determined using the current change amount and the voltage change amount (S104).

Next, the battery management apparatus 100 determines the deviation of internal resistance values (S105), and determines whether the deviation of the internal resistance values exceeds a predetermined reference value D (S106).

The battery cell may be diagnosed as a failure in response to a case in which the deviation of the internal resistance values exceeds the predetermined reference value D (S107).

The battery management apparatus 100 determines whether a number of times the deviation of the internal resistance values is determined exceeds a predetermined number of times in response to a case where the deviation of the internal resistance values is equal to or smaller than the predetermined reference value D, (S108), and stores the deviation of the internal resistance value of the corresponding battery cell in the storage 120 in response to a case where the number of times the deviation of the internal resistance values is determined does not exceed the predetermined number (S109).

In this case, the battery management apparatus 100 may perform steps S101 to S109 for all of the battery cells Cell 01 to Cell N to store all deviations in internal resistance values for each of the battery cells Cell 01 to Cell N.

Meanwhile, in response to a case where the number of times the deviation of the internal resistance values is determined exceeds the predetermined number, the battery management apparatus 100 stores the deviation of the internal resistance values of the corresponding battery cell in the storage 120, and determines whether the deviation of the internal resistance values has increased compared to the deviation of past internal resistance values by using the deviation of the internal resistance values N times (S111). For example, in response to a case where the deviation of the internal resistance value determined once is 5, the deviation of the internal resistance values determined 4 times is 7, and the deviation of the internal resistance values determined 8 times is 11, it may be determined that, for the battery management apparatus 100, the internal resistance value of the battery cell continued to increase and increased by 6 from 5 to 11, and thus the deviation of internal resistance values has increased compared to the deviation of past internal resistance values.

The battery management apparatus 100 may diagnose the corresponding battery cell as a failure in response to a case where the deviation of internal resistance values increases compared to the deviation of past internal resistance values (S107).

As such, according to the present disclosure, it is possible to accurately determine whether the internal resistance value increases by determining the internal resistance value by determining the current change amount from the current change request time point t1 to the target current reaching time point t2 and the voltage change amount from the current change request time point t1 to the target current reaching time point t2.

Additionally, according to the present disclosure, it is possible to accurately diagnose whether the battery cell is defective by accurately determining whether the internal resistance value increases.

In addition, according to the present disclosure, it is possible to determine whether the internal resistance value has increased simply due to battery deterioration by diagnosing whether the battery cell is defective using the deviation of internal resistance values, thereby accurately diagnosing whether the battery cell is defective.

Figure 16:
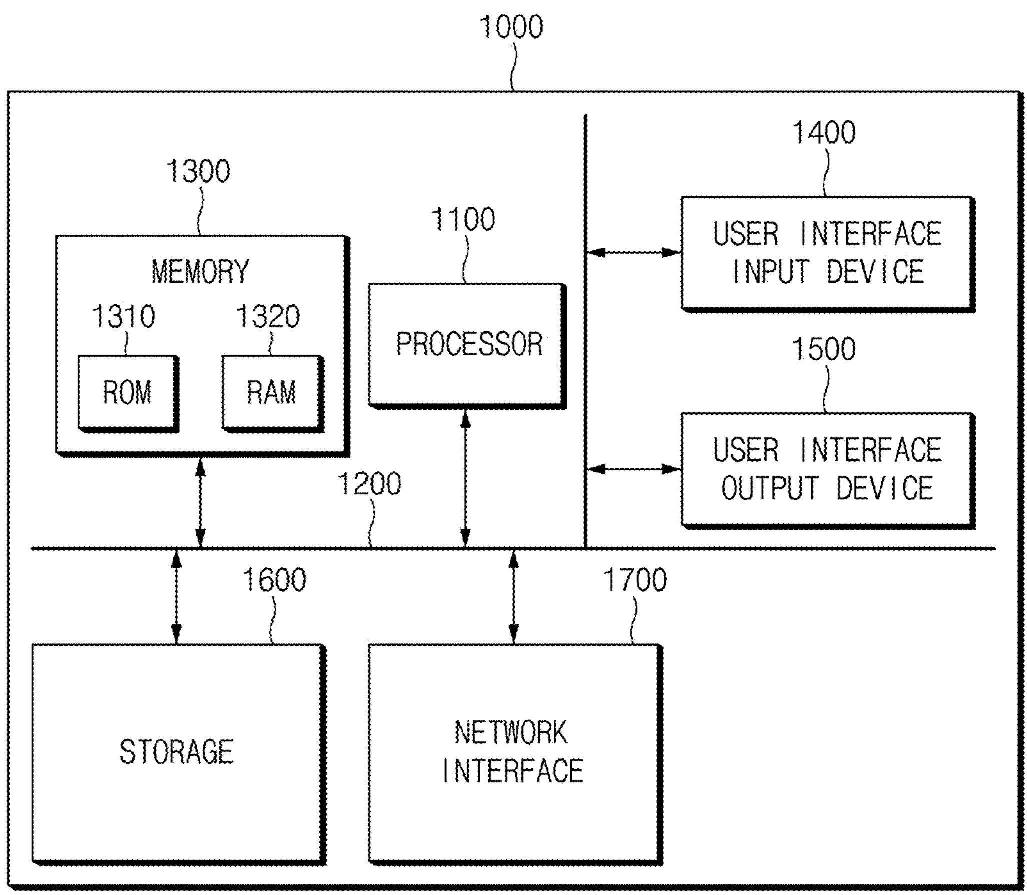
FIG. 16 illustrates an exemplary computing system.

FIG. 16 illustrates an example computing system.

Referring to FIG. 16, the computing system 1000 includes at least one processor 1100 connected through a bus 1200, a memory 1300, a user interface input device 1400, a user interface output device 1500, and a storage 1600, and a network interface 1700.

The processor 1100 may be a central processing unit (CPU) or a semiconductor device that performs processing on commands stored in the memory 1300 and/or the storage 1600. The memory 1300 and the storage 1600 may include various types of volatile or nonvolatile storage media. For example, the memory 1300 may include a read only memory (ROM) 1310 and a random access memory (RAM) 1320.

Accordingly, steps of a method or algorithm described in connection with the exemplary implementations disclosed herein may be directly implemented by hardware, a software module, or a combination of the two, executed by the processor 1100. The software module may reside in a storage medium (i.e., the memory 1300 and/or the storage 1600) such as a RAM memory, a flash memory, a ROM memory, an EPROM memory, an EEPROM memory, a register, a hard disk, a removable disk, and a CD-ROM.

An exemplary storage medium is coupled to the processor 1100, which can read information from and write information to the storage medium. Alternatively, the storage medium may be integrated with the processor 1100. The processor and the storage medium may reside within an application specific integrated circuit (ASIC). The ASIC may reside within a user terminal. Alternatively, the processor and the storage medium may reside as separate components within the user terminal.

The above description is merely illustrative of the technical idea of the present disclosure, and those skilled in the art to which the present disclosure pertains may make various modifications and variations without departing from the essential characteristics of the present disclosure.

What is claimed is:

1. A battery management apparatus comprising:

a control circuit configured to:

based on a voltage of a battery pack reaching a predetermined voltage during charge of the battery pack, determine a current change amount of the battery pack and a voltage change amount of one or more battery cells in the battery pack according to a current change request time point requiring a charging current change, determine an internal resistance value for each of the one or more battery cells based on the current change amount of the battery pack and the voltage change amount in the one or more battery cells, and diagnose, based on the battery pack being charged, one or more defects in the one or more battery cells according to the internal resistance values of the one or more battery cells, wherein the control circuit is configured to determine a deviation of the internal resistance values for each of one or more battery cells, wherein determining the deviation of the internal resistance values comprises determining the deviation of the internal resistance values for each of one or more battery cells one or more times, and wherein diagnosing the one or more defects in the one or more battery cells comprises determining, based on a deviation of an internal resistance value of a first battery cell, among the one or more battery cells, being increased, that the first battery cell has failed.

2. The battery management apparatus of claim 1, wherein determining the current change amount comprises:

determining the current change amount from the current change request time point to a time point at which a target current requesting the current change is reached.

3. The battery management apparatus of claim 1, wherein determining the voltage change amount comprises:

determining the voltage change amount from the current change request time point to a voltage change stabilization time point, which is a time point at which the voltage of the battery pack is stabilized.

4. The battery management apparatus of claim 1, further comprising:

a voltage sensor configured to measure a voltage of the one or more battery cells; and a current sensor configured to measure a current of the battery pack.

5. The battery management apparatus of claim 1, wherein determining the current change amount comprises:

determining, based on a state of charge (SOC) of the battery pack being greater than a predetermined reference value, the current change amount according to a measured current value.

6. The battery management apparatus of claim 1, wherein determining the current change amount comprises:

determining, based on a temperature of the battery pack being equal to or greater than a predetermined temperature, the current change amount according to a measured voltage value.

7. The battery management apparatus of claim 1, wherein the control circuit is configured to, based on a deviation of an internal resistance value of a second battery cell, among the one or more battery cells, exceeding a predetermined reference value, diagnose the second battery cell as a failure.

8. The battery management apparatus of claim 1, wherein the first battery cell is determined to be failed based on (i) the deviation of the internal resistance value of the first battery cell being increased and an increase amount of the deviation being exceeded a predetermined reference value or (ii) the deviation of the internal resistance value of the first battery cell continuing to increase.

9. A system comprising:

a battery management apparatus configured to:

measure a current of a battery pack including one or more battery cells, measure a voltage of each of the one or more battery cells, and based on the battery pack being charged, transmit the measured voltage of each of the one or more battery cells and the measured current of the battery pack; and a server configured to:

determine a current change amount of the battery pack and a voltage change amount of the one or more battery cells based on the voltage of the one or more battery cells and the current of the battery pack received from the battery management apparatus, determine an internal resistance value for each of the one or more battery cells based on the current change amount of the battery pack and the voltage change amount of the one or more battery cells, diagnose one or more defects in the one or more battery cells based on the internal resistance value for each of the one or more battery cells, and transmit, to the battery management apparatus, a result of the diagnosis, wherein determining the current change amount and the voltage change amount comprises:

determining, based on the voltage of the battery pack reaching a predetermined voltage during charge of the battery pack, the current change amount of the battery pack and the voltage change amount of the one or more battery cells according to a current change request time point requiring a charging current change, wherein the server is located outside a vehicle.

10. The system of claim 9, wherein determining the current change comprises:

determining the current change amount from the current change request time point to a time point at which a target current requesting the current change is reached.

11. The system of claim 9, wherein determining the voltage change amount comprises:

determining the voltage change amount from the current change request time point to a voltage change stabilization time point, which is a time point at which the voltage of the battery pack is stabilized.

12. The system of claim 9, wherein determining the current change amount comprises:

determining, based on a state of charge (SOC) of the battery pack being greater than a predetermined reference value, the current change amount according to the measured current.

13. The system of claim 9, wherein determining the current change amount comprises:

determining, based on a temperature of the battery pack being equal to or greater than a predetermined temperature, the current change amount according to the measured voltage.

14. The system of claim 9, wherein the server is configured to determine a deviation of the internal resistance values for each of one or more battery cells.

15. The system of claim 14, wherein the server is configured to, based on the deviation of the internal resistance values for each of the one or more battery cells exceeding a predetermined reference value, diagnose a corresponding battery cell as a failure.

16. The system of claim 14, wherein determining the deviation of the internal resistance values comprises determining a deviation of the internal resistance values for each of one or more battery cells one or more times, and wherein diagnosing that the corresponding battery cell has failed comprises determining, based on the deviation of the internal resistance values being increased, that the corresponding battery cell has failed.

17. The system of claim 9, wherein the battery management apparatus is positioned in the vehicle and configured to perform wireless communication with the server.

18. A battery management method comprising:

determining, by a processor, a current change amount of a battery pack including one or more battery cells and a voltage change amount of the one or more battery cells based on a current change request time point requiring a charging current change based on a voltage of the battery pack reaching a predetermined voltage during charge of the battery pack;

determining, by the processor, an internal resistance value for each of the one or more battery cells based on the current change amount of the battery pack and the voltage change amount of the one or more battery cells;

diagnosing, by the processor, one or more defects in the one or more battery cells based on the internal resistance value for each of the one or more battery cells; and determining a deviation of the internal resistance values for each of one or more battery cells, wherein determining the deviation of the internal resistance values comprises determining the deviation of the internal resistance values for each of one or more battery cells one or more times, and wherein diagnosing the one or more defects in the one or more battery cells comprises determining, based on a deviation of an internal resistance value of a first battery cell, among the one or more battery cells, being increased, that the first battery cell has failed.

* * * * *